United States Patent
Gimonet

(12) 
(10) Patent No.: US 6,392,276 B1
(45) Date of Patent: May 21, 2002

(54) DEVICE FOR PROTECTING AN SOI STRUCTURE

(75) Inventor: Sophie Gimonet, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/745,012

(22) Filed: Dec. 20, 2000

(30) Foreign Application Priority Data

Dec. 22, 1999 (FR) .............................................. 99 16289

(51) Int. Cl.[7] .............................................. H01L 27/01
(52) U.S. Cl. ...................................... 257/343; 257/355
(58) Field of Search ................ 257/353–354, 257/355

(56) References Cited

U.S. PATENT DOCUMENTS

| | | | |
|---|---|---|---|
| 5,181,091 A | * 1/1993 | Harrington, III et al. ... | 257/355 |
| 5,567,968 A | 10/1996 | Tsuruta et al. .............. | 257/356 |
| 5,767,562 A | 6/1998 | Yamashita et al. .......... | 257/500 |
| 5,963,785 A | 10/1999 | Katoh et al. ................ | 438/33 |
| 6,015,992 A | * 1/2000 | Chatterjee et al. .......... | 257/350 |
| 6,060,752 A | * 5/2000 | Williams .................... | 257/355 |

FOREIGN PATENT DOCUMENTS

EP A-0 923 132 6/1999 ........... H01L/27/02

OTHER PUBLICATIONS

Ohtomo Y et al, "A Quarter–Micron Simox–CMOS I VTTI–Compatible Gate Array With An Over 2,000 V ESD–Protection Circuit", Proccedings of The IEEE CUstom Integrated Circuits Conference (CICC), US, New York, vol. Conf 18, 1996, pp. 57–60.

* cited by examiner

Primary Examiner—Allan R. Wilson
(74) Attorney, Agent, or Firm—Wolf, Greenfield & Sacks, P.C.; James H. Morris

(57) ABSTRACT

A device for protecting a structure of SOI type including several insulated cells, each cell being formed of a portion of a semiconductor substrate of a first conductivity type having its bottom and its lateral walls delimited by an insulating area. A protective cell includes a first semiconductor region of the second conductivity type connected to a reference potential and several second regions of the second conductivity type separated from one another and from the first region. The substrate portion of each of the cells other than the protective cell is connected to one of the second regions.

4 Claims, 2 Drawing Sheets

DEVICE FOR PROTECTING AN SOI STRUCTURE

BACKGROUND OF THE INVENTION

1. Field of the Invention

The present invention relates to the protection of structures of silicon-on-insulator type (SOI), including cells having their bottoms and walls insulated by a dielectric material and in which different elementary components or groups of components are arranged. The protection of such cells against electrostatic discharges, capable of causing deterioration of the cells due to voltage breakdown, will more specifically be considered.

2. Discussion of the Related Art

SOI technologies are currently mainly used in the fields of low and medium voltage integrated circuits, that is, circuits intended for withstanding at most voltages on the order of some ten volts. In such integrated circuits, as the basic components become smaller and smaller, they become more and more sensitive to electrostatic discharges. Thus, conventionally, a system of protection against electrostatic discharges is often provided on all inputs/outputs of the various integrated circuit cells.

A specific problem arises in the case where an SOI technology is used to form circuits including high-power components, to which a high voltage is likely to be applied. In this case, in normal operation, differences of several hundreds of volts may be found between two neighboring cells. These cells must then be protected and the protection circuit must be calibrated so as not to be triggered in normal operation of the device but for being triggered before the high voltages exceed a predetermined threshold.

SUMMARY OF THE INVENTION

The present invention more specifically aims at solving the problem of protecting the oxides between cells or at the bottom of cells in the case where the structure includes cells that normally have to withstand high voltages.

To achieve this and other objects, the present invention provides a device for protecting a structure of SOI type including several insulated cells, each cell being formed of a portion of a semiconductor substrate of a first conductivity type having its bottom and its lateral walls delimited by an insulating area, including a protective cell that includes a first semiconductor region of the second conductivity type connected to a reference potential and several second regions of the second conductivity type separated from one another and from the first region, the substrate portion of each of the cells other than the protective cell being connected to one of the second regions.

According to an embodiment of the present invention, the bottom and the walls of each of the cells include a peripheral region of the first conductivity type of high doping level.

According to an embodiment of the present invention, the connection of each cell to the protective cell includes a region of the first conductivity type of high doping level, continuous with said peripheral doping region.

According to an embodiment of the present invention, the rear surface layer of the SOI structure is also connected to one of the second regions.

The foregoing objects, features and advantages of the present invention, will be discussed in detail in the following non-limiting description of specific embodiments in connection with the accompanying drawings.

DETAILED DESCRIPTION

As usual in the representation of semiconductor components, the various drawings are not to scale. Further, the scale is not respected either between the cross-section view of FIG. 2 and the top view of FIG. 3.

Figure 1:
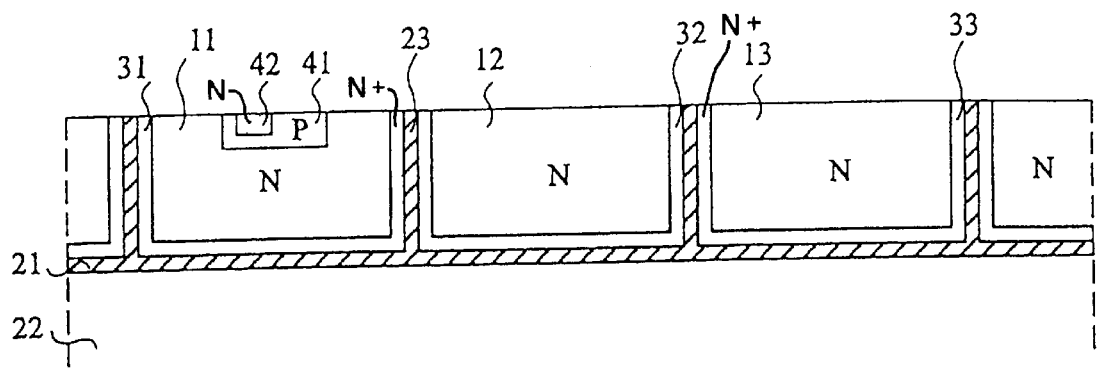
FIG. 1 shows an example of an SOI structure.

FIG. 1 shows an example of a conventional SOI structure. Each cell includes a portion of an N-type substrate 11, 12, 13. The bottom of each cell is insulated by a dielectric layer, currently a silicon oxide layer 21, from a lower wafer 22, currently a silicon wafer. The lateral walls of each cell are insulated by trenches 23 having their walls coated with a dielectric. Between each substrate portion 11, 12, 13 and the silicon oxide layer forming the bottom and the walls of this well portion is formed a heavily-doped N-type region, respectively 31, 32, 33. Regions 31, 32, 33 especially have the effect of avoiding the accumulation of charges at the edges of the silicon oxide layers.

A way to implement the structure of FIG. 1 includes starting from two silicon wafers. A first silicon wafer 22 has its upper surface coated with an oxide layer 21. An N+-type implantation is performed on the upper surface side of a second silicon wafer before oxidizing its surface. After this, the second silicon wafer is pasted by its upper surface on the upper surface of silicon wafer 22. The apparent surface of the second wafer is then shaved to reach a desired thickness. Trenches are etched in the second wafer, after which an N-type doping (to form the sides of regions 31–33) and an oxidation of the trench walls are then performed, the trenches being then filled with polysilicon.

Further, referring to FIG. 1, a P-type region 41 containing an N-type region 42 has been shown in insulated cell 11. This may for example form a vertical power transistor, the emitter of which corresponds to region 42, the base of which corresponds to region 41, and the collector of which corresponds to substrate 11. The collector contact will be annularly recovered on the portion of N+ region 31. This is only an example of a component that may be implemented in an insulated cell. This power component may have, if the thickness of silicon portions 11, 12, 13 is on the order of 60 μm, a breakdown voltage on the order of 600 volts. The problem of evacuating possible electrostatic discharges while maintaining the possibility of insulation for a value at least equal to 600 volts between two adjacent cells is then raised.

Figure 2:
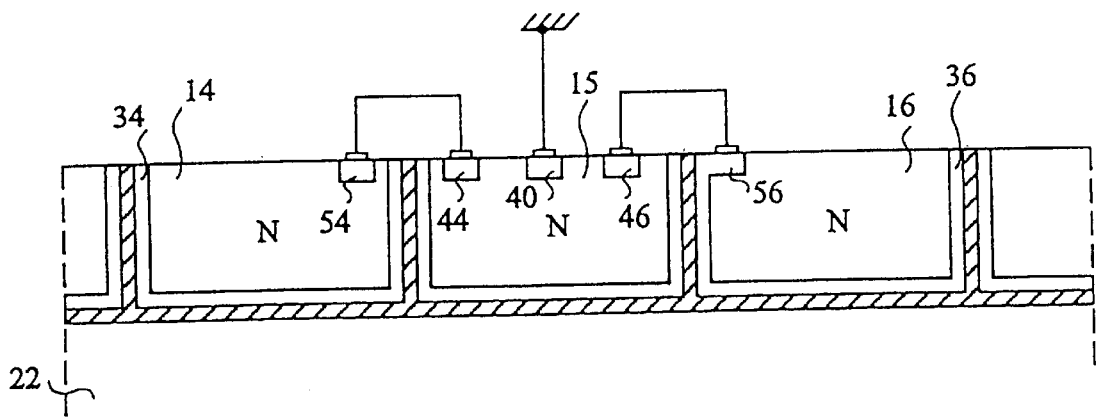
FIG. 2 shows a simplified cross-section view of a protective cell according to the present invention.
Figure 3:
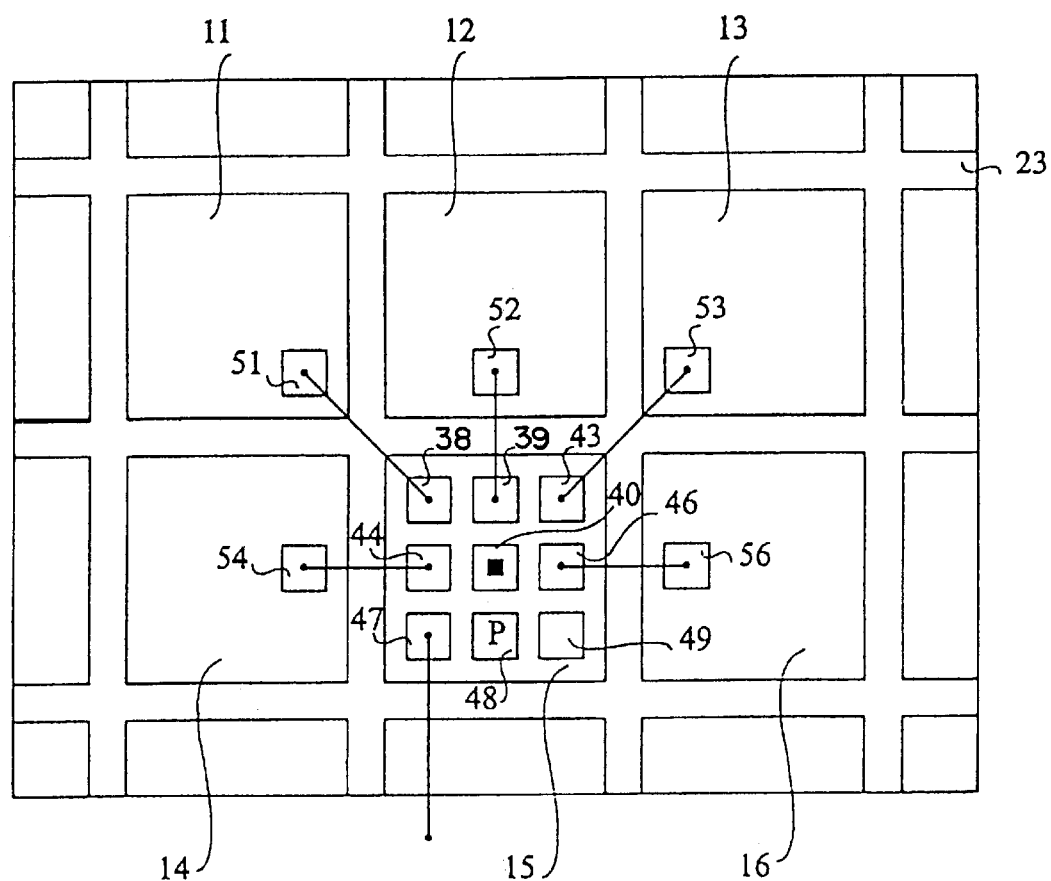
FIG. 3 shows a simplified top view of a protective structure according to the present invention.

To solve this problem, as illustrated in FIGS. 2 and 3, the present invention provides dedicating one of the cells of the SOI structure to a centralized protection function.

FIG. 2 shows a cross-section view along line II—II of FIG. 3. In FIG. 3, six cells 11 to 16 have been shown, cell 15 being dedicated to the protection function. The trenches separating the various wells are generally designated by reference 23, and the heavily-doped N-type regions arranged in the vicinity of the bottom and walls of each cell have not been shown in FIG. 3.

Cell 15 includes, in the example shown, nine P-type regions 38–40, 43–44 and 46–49. Region 40 is a central region 40 connected to the ground or to another reference potential. Regions 38, 39, 43, 44 and 46 are connected to contact areas 51 to 54 and 56 formed of heavily-doped N-type regions in respective substrate portions 11 to 14 and 16. A P-type region 47 is connected to a rear surface metallization of silicon wafer 22, for example by a jumper between metallization 47 and the package and a connection of the package to the rear surface. The last two regions, 48, 49, may be omitted or will be connected to other regions to be protected, for example, to another portion of the same cell. Of course, conventionally, connections between regions located on the same insulation surface substrate will be implemented by insulated metallizations.

FIG. 2 shows two examples of a substrate portion contacting arrangement. Substrate contacting area 54 is formed of an N+region separate from heavily-doped N-type periphery 34 of the cell. However, in cell 16, substrate contacting area 56 prolongs heavily-doped N-type region 36 surrounding the cell.

Also, considering cell 15 in the cross-section view of FIG. 2, each of P regions 44 and 46 appears to form with P region 40, from which it is separated by an N region, a bidirectional avalanche diode. This avalanche diode having the same substrate N as that of each of the active cells, its breakdown voltage, in each direction, will be the same as the breakdown voltage of each of the power components that may be formed in some of the other cells. Thus, it is ensured that there will be no premature breakdown when a "normal" high voltage is applied on one of the cells, in the absence of an electrostatic pulse. It should further be noted that, as for the power components formed in the other cells, the protection diodes will at least partially have a vertical operation.

Thus, the power component according to the present invention has the following properties:

being integrated on the same substrate as the other cells, it will not prematurely break down in normal operation, if its breakdown voltage against electrostatic discharges is chosen to be greater than that of the dielectrics of the various cells and to the specification of the various components, it will redirect electrostatic discharges.

Of course, the present invention is likely to have various alterations, modifications, and improvements which will readily occur to those skilled in the art. In particular, the arrangement of the various P-type regions in protective cell 15 may be chosen by those skilled in the art to improve or optimize various parameters.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for protecting a structure of SOI type including several insulated cells, each cell being formed of a portion of a semiconductor substrate of a first conductivity type having its bottom and its lateral walls delimited by an insulating area, including a protective cell that includes a first semiconductor region of the second conductivity type connected to a reference potential and several second regions of the second conductivity type separated from one another and from the first region, the substrate portion of each of the cells other than the protective cell being connected to one of the second regions.

2. The protection device of claim 1, wherein the bottom and the walls of each of the cells include a peripheral region of the first conductivity type of high doping level.

3. The protection device of claim 2, wherein the connection of each cell to the protective cell includes a region of the first conductivity type of high doping level, in continuity with said peripheral doping region.

4. The protection device of claim 1, wherein the rear surface layer of the SOI structure is also connected to one of the second regions.

\* \* \* \* \*